(12) United States Patent
Jiang et al.

(10) Patent No.: US 11,578,409 B2
(45) Date of Patent: Feb. 14, 2023

(54) LOW DEPOSITION RATES FOR FLOWABLE PECVD

(71) Applicant: Applied Materials, Inc., Santa Clara, CA (US)

(72) Inventors: Shishi Jiang, Santa Clara, CA (US); Pramit Manna, Sunnyvale, CA (US); Abhijit Basu Mallick, Palo Alto, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 16/895,579

(22) Filed: Jun. 8, 2020

(65) Prior Publication Data

US 2020/0385865 A1   Dec. 10, 2020

Related U.S. Application Data

(60) Provisional application No. 62/858,994, filed on Jun. 8, 2019.

(51) Int. Cl.

| | | |
|---|---|---|
| *H01L 21/02* | (2006.01) | |
| *C23C 16/50* | (2006.01) | |
| *C23C 16/30* | (2006.01) | |
| *C23C 16/24* | (2006.01) | |
| *C23C 16/34* | (2006.01) | |
| *C23C 16/32* | (2006.01) | |
| *C23C 16/36* | (2006.01) | |
| *H01L 21/285* | (2006.01) | |

(52) U.S. Cl.
CPC ............ *C23C 16/50* (2013.01); *C23C 16/24* (2013.01); *C23C 16/308* (2013.01); *C23C 16/325* (2013.01); *C23C 16/345* (2013.01); *C23C 16/36* (2013.01); *H01L 21/0262* (2013.01); *H01L 21/02274* (2013.01); *H01L 21/02532* (2013.01); *H01L 21/28518* (2013.01)

(58) Field of Classification Search
None
See application file for complete search history.

(56) References Cited

U.S. PATENT DOCUMENTS

| | | |
|---|---|---|
| 2010/0099271 A1 | 4/2010 | Hausmann et al. |
| 2011/0256726 A1 | 10/2011 | Lavoie |
| 2012/0149213 A1 | 6/2012 | Nittala |
| 2013/0040102 A1 | 2/2013 | Gleason et al. |
| 2014/0113457 A1 * | 4/2014 | Sims ................... C23C 16/045 438/792 |
| 2017/0372919 A1 | 12/2017 | Manna et al. |
| 2018/0286669 A1 | 10/2018 | Mallick et al. |
| 2019/0376186 A1 * | 12/2019 | Haverkamp ............ C23C 16/54 |
| 2021/0025058 A1 | 1/2021 | Jiang et al. |

OTHER PUBLICATIONS

Metzler, Meredith, et al., "Plasma Enhanced Chemical Vapor Deposition (PECVD) of Silicon Nitride (SiNx) Using Oxford Instruments System 100 PECVD", Tool Data. Paper 35.
PCT International Search Report and Written Opinion in PCT/US2020/036585 dated Sep. 11, 2020, 11 pages.

* cited by examiner

*Primary Examiner* — Asok K Sarkar
(74) *Attorney, Agent, or Firm* — Servilla Whitney LLC

(57) ABSTRACT

PECVD methods for depositing a film at a low deposition rate comprising intermittent activation of the plasma are disclosed. The flowable film can be deposited using at least a polysilane precursor and a plasma gas. The deposition rate of the disclosed processes may be less than 500 Å/min.

20 Claims, 1 Drawing Sheet

LOW DEPOSITION RATES FOR FLOWABLE PECVD

CROSS-REFERENCE TO RELATED APPLICATIONS

This application claims priority to U.S. Provisional Application No. 62/858,994, filed Jun. 8, 2019, the entire disclosure of which is hereby incorporated by reference herein.

TECHNICAL FIELD

The present disclosure relates generally to methods of depositing thin films. In particular, the disclosure relates to processes for filling narrow trenches with a flowable film deposited at a relatively low rate.

BACKGROUND

In microelectronics device fabrication there is a need to fill narrow trenches having aspect ratios (AR) greater than 10:1 with no voiding for many applications. One application is for shallow trench isolation (STI). For this application, the film needs to be of high quality throughout the trench (having, for example, a wet etch rate ratio less than two) with very low leakage. As the dimensions of the structures decrease and the aspect ratios increase post curing methods of the as deposited flowable films become difficult. Resulting in films with varying composition throughout the filled trench.

Amorphous silicon has been widely used in semiconductor fabrication processes as a sacrificial layer since it can provide good etch selectivity with respect to other films (e.g., silicon oxide, silicon nitride amorphous carbon, etc.). With decreasing critical dimensions (CD) in semiconductor fabrication, filling high aspect ratio gaps becomes increasingly sensitive for advanced wafer fabrication. Current metal replacement gate processes involve a furnace polysilicon or amorphous silicon dummy gate. A seam forms in the middle of the Si dummy gate due to the nature of process. This seam may be opened up during the post process and cause structure failure.

Conventional plasma-enhanced chemical vapor deposition (PECVD) of amorphous silicon (a-Si) forms a "mushroom shape" film on top of the narrow trenches. This is due to the inability of the plasma to penetrate into the deep trenches. This results in pinching-off the narrow trench from the top and forms a void at the bottom of the trench.

Flowable processes for dielectric films (e.g., silicon oxide, silicon nitride, siliconcarbon-nitride etc.) are typically performed using a remote plasma source (RPS). RPS generates reactive radicals outside of the deposition chamber. The reactive radicals are then introduced to the deposition chamber and react with precursors containing silicon to deposit a flowable film.

To deposit a flowable silicon film, where no elements other than hydrogen are allowed, hydrogen radicals are the only choice. However, due to the short life span of hydrogen radicals, it can be challenging to deposit a film with a remote plasma since many of the radicals will quench during the transfer from the remote source to the deposition chamber.

Other processes for depositing flowable silicon films use direct CCP. However, when a direct plasma is used the density of radicals increases. When a CCP is used, it can also break down the silicon containing precursors. Accordingly, the deposition rate of direct CCP processes is usually much higher when compared to remote plasma processes.

For flowable processes, it can be very important to control the deposition rate, so as to achieve a desirable thickness. The thickness can be crucial for "dep/treat" process which periodically treat and/or cure the film during deposition. Dep/Treat processes rely on treatments which may only affect a certain depth of the deposited film. If more film is deposited than can be treated an incomplete treatment will occur.

Therefore there is a need in the art for low deposition rate processes which allow for better control of the thickness of flowable films deposited by PECVD.

SUMMARY

One or more embodiments of the disclosure are directed to a method comprising simultaneously exposing a substrate surface having at least one feature thereon to reactants comprising a polysilane precursor and a plasma gas. The plasma gas is ignited at a regular interval to form a plasma and deposit a flowable film on the substrate surface within the at least one feature.

Additional embodiments of the disclosure are directed to a method comprising simultaneously exposing a substrate surface having at least one feature thereon to reactants comprising a polysilane precursor and a plasma gas. The plasma gas is ignited at a regular interval to form a plasma and deposit a flowable silicon-containing film on the substrate surface within the at least one feature. The regular interval has a duty cycle less than 40%. The flowable silicon-containing film is deposited at a rate of less than or equal to about 500 Å/min.

Further embodiments of the disclosure are directed to a method comprising simultaneously exposing a substrate surface having at least one feature thereon to reactants comprising a polysilane precursor and a plasma gas. The polysilane precursor comprises one or more of disilane, trisilane, tetrasilane, neopentasilane or cyclohexasilane, TSA, TEOS, TRIES, TMOS, TRIMOS. The plasma gas comprises one or more of He, Ar, Kr, $H_2$, $N_2$, $O_2$, $O_3$ or $NH_3$. The plasma gas is ignited at a regular interval to form a plasma and deposit a flowable film on the substrate surface within the at least one feature. The regular interval has a duty cycle less than 40%. The plasma has a power less than or equal to about 200 W. The film comprises one or more of Si, SiN, SiO, SiC, SiCN, SiOC, SiON, SiCON. The substrate surface is maintained at a temperature of less than or equal to about 50° C. The flowable film is deposited at a rate of less than or equal to about 500 Å/min.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Figure 1:
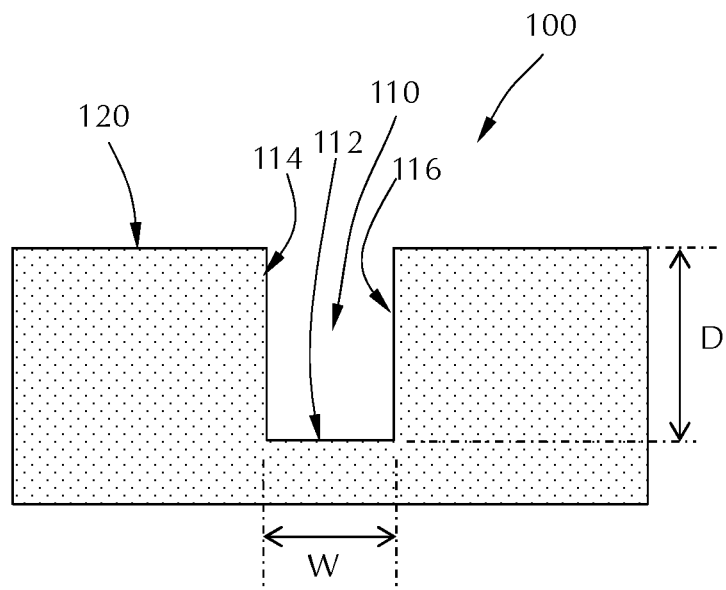
FIG. 1 shows a cross-sectional view of a substrate feature in accordance with one or more embodiment of the disclosure.

Before describing several exemplary embodiments of the invention, it is to be understood that the invention is not limited to the details of construction or process steps set forth in the following description. The invention is capable of other embodiments and of being practiced or being carried out in various ways.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal, UV cure, e-beam cure and/or bake the substrate surface. In addition to film processing directly on the surface of the substrate itself, in the present invention, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface.

Embodiments of the disclosure provide methods of depositing a film (e.g., a flowable silicon-containing film) at a low deposition rate. Some embodiments advantageously provide low deposition rates which provide easier thickness control in cyclic deposition-treatment processes. Some embodiments advantageously provide seam-free high quality amorphous silicon-containing films in high AR trenches with small dimensions.

One or more embodiments of the disclosure are directed to processes where a flowable film is deposited using a plasma ignited at a regular interval. Stated differently, the plasma is only applied intermittently. The films can be deposited using a plasma enhanced chemical vapor deposition (PECVD) with a polysilane precursor at low temperature (e.g., less than 50° C.). Plasma power for the process can be kept below about 200 W to reduce the reaction kinetics and obtain haze free films. Disilane, trisilane, tetrasilane, neopentasilane, cyclohexasilanes are typical polysilanes which can be used.

Embodiments of the process allow for the preparation of flowable films comprising one or more of carbon, oxygen or nitrogen by the addition of hydrocarbons, oxygen sources and nitrogen sources to the flowable silicon process. Additionally, flowable metal silicides (WSi, TaSi, NiSi) can be deposited by the addition of an appropriate metal precursor to the flowable silicon process.

As used in this specification and the appended claims, a "flowable film" is a fluid material that can move and flow into openings (e.g., trenches) and cover irregular (rough) surfaces. In some embodiments, a flowable film is cured to remove or reduce the fluid nature of the film to create a solid or non-fluid film.

FIG. 1 shows a partial cross-sectional view of a substrate 100 with a feature 110. The Figures show substrates having a single feature for illustrative purposes; however, those skilled in the art will understand that there can be more than one feature. The shape of the feature 110 can be any suitable shape including, but not limited to, trenches and cylindrical vias. As used in this regard, the term "feature" means any intentional surface irregularity. Suitable examples of features include, but are not limited to trenches which have a top, two sidewalls and a bottom, peaks which have a top and two sidewalls. Features can have any suitable aspect ratio (ratio of the depth of the feature to the width of the feature). In some embodiments, the aspect ratio is greater than or equal to about 5:1, 10:1, 15:1, 20:1, 25:1, 30:1, 35:1 or 40:1.

The substrate 100 has a substrate surface 120. The at least one feature 110 forms an opening in the substrate surface 120. The feature 110 extends from the substrate surface 120 to a depth D to a bottom surface 112. The feature 110 has a first sidewall 114 and a second sidewall 116 that define a width W of the feature 110. The open area formed by the sidewalls and bottom are also referred to as a gap.

One or more embodiments of the disclosure are directed to processing methods in which a substrate surface with at least one feature thereon is provided. As used in this regard, the term "provided" means that the substrate is placed into a position or an environment for further processing. Positioning or providing a substrate for processing can include leaving a substrate in the same position, process chamber, or susceptor as a previous processing operation.

Figure 2:
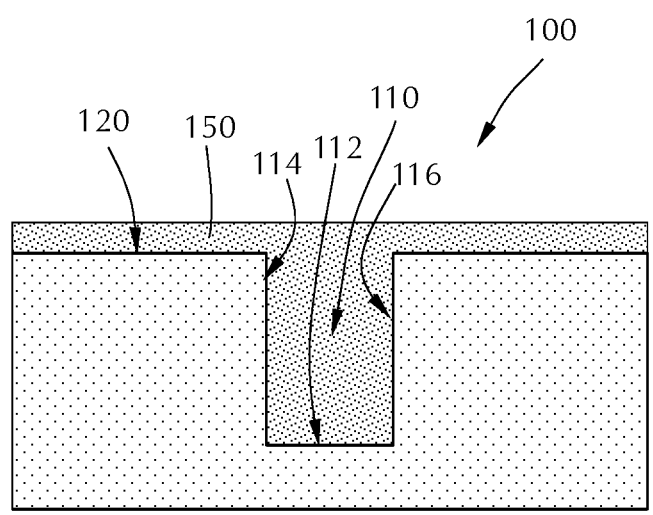
FIG. 2 shows a cross-sectional view of the substrate feature of FIG. 1 with a flowable film thereon.

As shown in FIG. 2, a flowable film 150 is deposited on the substrate surface 120 and the first sidewall 114, second sidewall 116 and bottom surface 112 of the at least one feature 110.

In some embodiments, the flowable film 150 fills the at least one feature 110 so that substantially no seam is formed. A seam is a gap that forms in the feature between, but not necessarily in the middle of, the sidewalls of the feature 110. As used in this regard, the term "substantially no seam" means that any gap formed in the film between the sidewalls is less than about 1% of the cross-sectional area of the sidewall.

The flowable film 150 can be deposited by any suitable plasma-enhanced chemical vapor deposition (PECVD) process. In some embodiments, the flowable film is deposited by a PECVD process using a direct plasma. In some embodiments, the flowable film is deposited by a PECVD process using a CCP plasma.

The PECVD process of some embodiments comprises exposing the substrate surface to a reactive gas. In some embodiments, the reactive gas comprise a plurality of reactants. In these embodiments, the reactants are exposed to the substrate surface simultaneously. For example, the reactants may comprise a polysilane precursor and a plasma gas. The plasma gas can be any suitable gas that can be ignited to form a plasma and/or can act as a carrier or diluent for the polysilane precursor. In some embodiments, one or more of the reactants are flowed together into the processing chamber. In some embodiments, the reactants are flowed into the processing chamber separately.

The process of some embodiments switches the plasma on and off during processing. Stated differently, the plasma of some embodiments is ignited at a regular interval.

In some embodiments, the polysilane precursor comprises a higher order silane, also referred to as a polysilicon species or a polysilicon precursor. The polysilane precursor of some embodiments comprises one or more of disilane, trisilane, and tetrasilane. In some embodiments, the polysilicon precursor comprises one or more of neopentasilane and cyclohexasilane. In some embodiments, the polysilicon precursor comprises one or more of trisilylamine (TSA), tetraethoxysilane (TEOS), triethoxysilane (TRIES), tetramethoxysilane (TMOS), or trimethoxysilane (TRIMOS). In some embodiments, the polysilane precursor comprises or consists essentially of disilane, trisilane, tetrasilane, neopentasilane or cyclohexasilane. As used in this regard, the term "consists essentially of" means that the silicon species of the reactive gas is made up of greater than or equal to about 95%, greater than or equal to about 98%, greater than or equal to about 99%, greater than or equal to about 99.5%, or greater than or equal to about 99.9% of the designated species on a molar basis. For example, a polysilane precursor consisting essentially of tetrasilane means that the silicon species of the reactive gas are greater than or equal to about 95% or more tetrasilane on a molar basis.

In some embodiments, the plasma gas comprises one or more of He, Ar, $H_2$, Kr, $N_2$, $O_2$, $O_3$ or $NH_3$. The plasma gas of some embodiments is used as a diluent or carrier gas for the other reactant(s) (e.g., the polysilane precursor) of the reactive gas.

The plasma is generated or ignited within the processing chamber (e.g., a direct plasma) by igniting the plasma gas to form a plasma. As mentioned previously, the plasma may be ignited at a regular interval. A "regular" interval means that the time of plasma ignitions is about equally spaced. In some embodiments, a regular interval means that the times that the plasma is ignited for is about the same. In some embodiments, regular intervals means that the plasma is ignited for about the same amount of time and the time difference between the ignitions is about the same. Stated differently, during processing, the plasma source will be switched on to generate the plasma and off to allow the plasma gas to remain unaffected by the plasma.

The cycling of the plasma can occur over any time frame. For example, the plasma may be on for one second and off for one second before the cycle repeats or the plasma may be on for 50 ms and off for 50 ms before the cycle repeats.

Similarly, the active and inactive periods of the plasma cycle may be uneven. For example, the plasma may be on for 400 ms and off for 100 ms, or vice versa. The percentage of a cycle in which the plasma is active is referred to as the duty cycle of the plasma. For example, the 400 ms active and 100 ms inactive would be a duty cycle of about 80%.

In some embodiments, the regular interval has a duty cycle in a range of about 5% to about 90%. In some embodiments, the regular interval has a duty cycle that is less than or equal to about 90%, less than or equal to about 80%, less than or equal to about 70%, less than or equal to about 60%, less than or equal to about 50%, less than or equal to about 40%, less than or equal to about 30%, less than or equal to about 25%, less than or equal to about 20%, less than or equal to about 15%, or less than or equal to about 10%.

The plasma power can be maintained at a low enough power to prevent reduction of the polysilicon species to silanes and/or to minimize or prevent haze formation in the film. In some embodiments, the plasma power is in a range of about 10 W to about 200 W. In some embodiments, the plasma power is less than or equal to about 200 W, less than or equal to about 150 W, less than or equal to about 100 W, less than or equal to about 50 W, less than or equal to about 25 W or less than or equal to about 20 W.

The plasma frequency may be any suitable frequency. In some embodiments, the plasma has a frequency in a range of about 10 Hz to about 10 kHz. In some embodiments, the plasma frequency is less than or equal to about 10 kHz, less than or equal to about 5 kHz, less than or equal to about 2 kHz, less than or equal to about 1 kHz, less than or equal to about 500 Hz, less than or equal to about 200 Hz, less than or equal to about 100 Hz, less than or equal to about 50 Hz, or less than or equal to about 20 Hz. In some embodiments, the plasma frequency is greater than or equal to about 10 Hz, greater than or equal to about 20 Hz, greater than or equal to about 50 Hz, greater than or equal to about 100 Hz, greater than or equal to about 200 Hz, greater than or equal to about 500 Hz, greater than or equal to about 1 kHz, greater than or equal to about 2 kHz, or greater than or equal to about 5 kHz.

The parameters of the plasma can be controlled to provide a predetermined deposition rate. Each of the plasma parameters discussed above may be expected to have an effect on the deposition rate of the flowable film.

The deposition rate is provided as a given thickness of the deposited film (before any change due to flowing) in a given unit of time. For example, for a film with a deposition rate of 100 Å/min, 50 Å will be deposited in 30 seconds on a flat surface.

In some embodiments, the flowable film is deposited at a rate in a range of about 300 Å/min to about 900 Å/min. In some embodiments, the flowable film is deposited at a rate of less than or equal to about 750 Å/min, less than or equal to about 600 Å/min, less than or equal to about 500 Å/min, less than or equal to about 450 Å/min, less than or equal to about 400 Å/min, less than or equal to about 350 Å/min, less than or equal to about 300 Å/min, or less than or equal to about 250 Å/min.

In addition to controlling the parameters of the plasma exposure, additional process parameters can also be controlled. Specifically, the deposition temperature, the processing pressure, the spacing between plasma and wafer, the selection of the polysilane precursor and the ratio between the precursor and any diluent in the reactive gas can be tailored to maintain the flowability of the deposited flowable film.

The flowable film 150 can be deposited at any suitable temperature. In some embodiments, the flowable film 150 is deposited at a temperature in the range of about −100° C. to about 50° C. The temperature can be kept low to preserve the thermal budget of the device being formed and limit reactions when the plasma is inactive. In some embodiments, depositing the flowable film occurs at a temperature less than about 50° C., 25° C., 20° C., 10° C., 5° C., 0° C., −10° C., −20° C., −25° C., −50° C. or −80° C.

The flowable film 150 can be deposited at any suitable chamber pressure. In some embodiments, the flowable film 150 is deposited at a pressure in the range of about 1 Torr to about 10 Torr. In some embodiments, the pressure is greater than or equal to about 1 Torr, greater than or equal to about 2 Torr, greater than or equal to about 3 Torr, greater than or equal to about 5 Torr, greater than or equal to about 7 Torr, or greater than or equal to about 9 Torr. In some embodiments, the pressure is less than or equal to about 10 Torr, less than or equal to about 9 Torr, less than or equal to about 8 Torr, less than or equal to about 7 Torr, less than or equal to about 5 Torr, or less than or equal to about 3 Torr.

The composition of the flowable film can be adjusted by changing the composition of the reactants. In some embodiments, the flowable film comprises silicon. In some embodiments, the flowable film consists essentially of silicon. As used in this regard, the term "consists essentially of" means that the flowable film is made up of greater than or equal to about 98%, greater than or equal to about 99%, greater than or equal to about 99.5%, or greater than or equal to about 99.9% of silicon on an atomic basis excluding hydrogen.

In some embodiments, the flowable film comprises one or more of SiN, SiO, SiC, SiOC, SiCN, SiON, SiCON. To deposit an oxygen containing film, the reactive gas may comprise, for example, one or more of $O_2$, ozone, $N_2O$ or water. To deposit a nitrogen containing film, the reactive gas may comprise, for example, one or more of ammonia, hydrazine, $NO_2$ or $N_2$. To deposit a carbon containing film, the reactive gas may comprise, for example, one or more of propylene and acetylene. Those skilled in the art will understand that combinations of or other species can be included in the reactants to change the composition of the flowable film.

In some embodiments, the flowable film comprises a metal silicide. The reactive gas mixture may include, for example, a precursor comprising one or more of tungsten, tantalum or nickel. Other metal precursors can be included to change the composition of the flowable film.

In some embodiments, after depositing the flowable film 150, the film is cured to solidify the flowable film. In some embodiments, after curing, the cured film forms a substantially seam-free gapfill. In some embodiments, the flowable film is cured by exposing the film to a UV curing process. The UV curing process can occur at a temperature in the range of about 10° C. to about 550° C. The UV curing process can occur for any suitable time frame necessary to sufficiently solidify the flowable film. In some embodiments, the UV cure occurs for less than or equal to about 10 minutes, 9 minutes, 8 minutes, 7 minutes, 6 minutes, 5 minutes, 4 minutes, 3 minutes, 2 minutes or 1 minute.

In some embodiments, curing the flowable film comprises exposure to a plasma or an electron beam. A plasma exposure to cure the film comprises a plasma separate from the PECVD plasma. The plasma species and processing chamber can be the same, but the plasma cure is a different step than the PECVD process.

Some embodiments of the disclosure provide cured gapfill films with low hydrogen content. In some embodiments, after curing the film, the gapfill film has a hydrogen content less than or equal to about 10 atomic percent. In some embodiments, the cured film has a hydrogen content less than or equal to about 5 atomic percent.

According to one or more embodiments, the substrate is subjected to processing prior to and/or after depositing the film. This processing can be performed in the same chamber or in one or more separate processing chambers. In some embodiments, the substrate is moved from the first chamber to a separate, second chamber for further processing. The substrate can be moved directly from the first chamber to the separate processing chamber, or it can be moved from the first chamber to one or more transfer chambers, and then moved to the separate processing chamber. Accordingly, the processing apparatus may comprise multiple chambers in communication with a transfer station. An apparatus of this sort may be referred to as a "cluster tool" or "clustered system," and the like.

Generally, a cluster tool is a modular system comprising multiple chambers which perform various functions including substrate center-finding and orientation, degassing, annealing, deposition and/or etching. According to one or more embodiments, a cluster tool includes at least a first chamber and a central transfer chamber. The central transfer chamber may house a robot that can shuttle substrates between and among processing chambers and load lock chambers. The transfer chamber is typically maintained at a vacuum condition and provides an intermediate stage for shuttling substrates from one chamber to another and/or to a load lock chamber positioned at a front end of the cluster tool. Two well-known cluster tools which may be adapted for the present invention are the Centura® and the Endura®, both available from Applied Materials, Inc., of Santa Clara, Calif. However, the exact arrangement and combination of chambers may be altered for purposes of performing specific steps of a process as described herein. Other processing chambers which may be used include, but are not limited to, cyclical layer deposition (CLD), atomic layer deposition (ALD), chemical vapor deposition (CVD), physical vapor deposition (PVD), etch, pre-clean, chemical clean, thermal treatment such as RTP, plasma nitridation, degas, orientation, hydroxylation and other substrate processes. By carrying out processes in a chamber on a cluster tool, surface contamination of the substrate with atmospheric impurities can be avoided without oxidation prior to depositing a subsequent film.

According to one or more embodiments, the substrate is continuously under vacuum or "load lock" conditions, and is not exposed to ambient air when being moved from one chamber to the next. The transfer chambers are thus under vacuum and are "pumped down" under vacuum pressure. Inert gases may be present in the processing chambers or the transfer chambers. In some embodiments, an inert gas is used as a purge gas to remove some or all of the reactants. According to one or more embodiments, a purge gas is injected at the exit of the deposition chamber to prevent reactants from moving from the deposition chamber to the transfer chamber and/or additional processing chamber. Thus, the flow of inert gas forms a curtain at the exit of the chamber.

The substrate can be processed in single substrate deposition chambers, where a single substrate is loaded, processed and unloaded before another substrate is processed. The substrate can also be processed in a continuous manner, similar to a conveyer system, in which multiple substrate are individually loaded into a first part of the chamber, move through the chamber and are unloaded from a second part of the chamber. The shape of the chamber and associated conveyer system can form a straight path or curved path. Additionally, the processing chamber may be a carousel in which multiple substrates are moved about a central axis and are exposed to deposition, etch, annealing, cleaning, etc. processes throughout the carousel path.

During processing, the substrate can be heated or cooled. Such heating or cooling can be accomplished by any suitable means including, but not limited to, changing the temperature of the substrate support and flowing heated or cooled gases to the substrate surface. In some embodiments, the substrate support includes a heater/cooler which can be controlled to change the substrate temperature conductively. In one or more embodiments, the gases (either reactive gases or inert gases) being employed are heated or cooled to locally change the substrate temperature. In some embodiments, a heater/cooler is positioned within the chamber adjacent the substrate surface to convectively change the substrate temperature.

The substrate can also be stationary or rotated during processing. A rotating substrate can be rotated continuously or in discrete steps. For example, a substrate may be rotated throughout the entire process, or the substrate can be rotated by a small amount between exposures to different reactive or purge gases. Rotating the substrate during processing (either continuously or in steps) may help produce a more uniform deposition or etch by minimizing the effect of, for example, local variability in gas flow geometries.

Reference throughout this specification to "one embodiment," "certain embodiments," "one or more embodiments" or "an embodiment" means that a particular feature, structure, material, or characteristic described in connection with the embodiment is included in at least one embodiment of the invention. Thus, the appearances of the phrases such as "in one or more embodiments," "in certain embodiments," "in one embodiment" or "in an embodiment" in various places throughout this specification are not necessarily referring to the same embodiment of the invention. Furthermore, the particular features, structures, materials, or characteristics may be combined in any suitable manner in one or more embodiments.

Although the invention herein has been described with reference to particular embodiments, it is to be understood that these embodiments are merely illustrative of the principles and applications of the present invention. It will be apparent to those skilled in the art that various modifications and variations can be made to the method and apparatus of the present invention without departing from the spirit and scope of the invention. Thus, it is intended that the present invention include modifications and variations that are within the scope of the appended claims and their equivalents.

What is claimed is:

1. A method comprising:
   simultaneously exposing a substrate surface having at least one feature thereon to reactants comprising a polysilane precursor and a plasma gas; and
   igniting the plasma gas at a regular interval to form a plasma and deposit a flowable film on the substrate surface within the at least one feature, the flowable film deposited at a rate of less than or equal to about 500 Å/min.

2. The method of claim 1, wherein the flowable film is deposited at a rate of less than or equal to about 250 Å/min.

3. The method of claim 1, wherein the regular interval has a duty cycle in a range of about 5% to about 90%.

4. The method of claim 3, wherein the duty cycle is less than or equal to about 40%.

5. The method of claim 1, wherein the polysilane precursor comprises one or more of disilane, trisilane, tetrasilane, neopentasilane or cyclohexasilane.

6. The method of claim 1, wherein the plasma gas comprises one or more of He, Ar, Kr, $H_2$, $N_2$, $O_2$, $O_3$ or $NH_3$.

7. The method of claim 1, wherein the plasma has a power less than or equal to about 200 W.

8. The method of claim 1, wherein forming the flowable film occurs at a temperature of less than or equal to about 50° C.

9. The method of claim 1, wherein the flowable film comprises one or more of SiN, SiO, SiC, SiOC, SiCN, SiON, or SiCON.

10. The method of claim 9, wherein the reactants further comprise one or more of propylene, acetylene, ammonia, hydrazine, $NO_2$, $N_2$, $N_2O$, $O_2$, ozone or water.

11. The method of claim 1, wherein the flowable film comprises a metal silicide.

12. The method of claim 11, wherein the reactants further comprise one or more tungsten, tantalum and/or nickel precursors.

13. The method of claim 1, wherein the flowable film consists essentially of silicon.

14. The method of claim 1, further comprising curing the flowable film to form a substantially seam-free gapfill.

15. The method of claim 14, wherein the gapfill has a hydrogen content of less than or equal to about 10 atomic percent.

16. A method comprising:
    simultaneously exposing a substrate surface having at least one feature thereon to reactants comprising a polysilane precursor and a plasma gas;
    igniting the plasma gas at a regular interval to form a plasma and deposit a flowable silicon-containing film on the substrate surface within the at least one feature, the regular interval having a duty cycle less than 40%, and the flowable silicon-containing film being deposited at a rate of less than or equal to about 500 Å/min; and
    curing the flowable film to form a substantially seam-free gapfill.

17. The method of claim 16, wherein the flowable silicon-containing film comprises one or more of Si, SiN, SiO, SiC, SiCN, SiOC, SiON, SiCON.

18. The method of claim 16, wherein the plasma has a power less than or equal to about 200 W and a frequency in a range of about 10 Hz to about 10 kHz.

19. The method of claim 16, wherein forming the flowable silicon-containing film occurs at a temperature of less than or equal to about 50° C. and a pressure in a range of about 1 Torr to about 10 Torr.

20. A method comprising:
    simultaneously exposing a substrate surface having at least one feature thereon to reactants comprising a polysilane precursor and a plasma gas, the polysilane precursor comprising one or more of disilane, trisilane, tetrasilane, neopentasilane, or cyclohexasilane, the plasma gas comprising one or more of He, Ar, Kr, $H_2$, $N_2$, $O_2$, $O_3$ or $NH_3$;
    igniting the plasma gas at a regular interval to form a plasma and deposit a flowable film on the substrate surface within the at least one feature, the regular interval having a duty cycle less than 40%, the plasma having a power less than or equal to about 200 W, the film consisting essentially of silicon, the substrate surface being maintained at a temperature of less than or equal to about 50° C., and the flowable film being deposited at a rate of less than or equal to about 250 Å/min; and
    curing the flowable film to form a substantially seam-free gapfill.

* * * * *